(12) United States Patent
Hayamizu et al.

(10) Patent No.: US 8,187,954 B2
(45) Date of Patent: May 29, 2012

(54) METHOD FOR MANUFACTURING SILICON SINGLE CRYSTAL WAFER

(75) Inventors: Yoshinori Hayamizu, Nishishirakawa (JP); Hiroyasu Kikuchi, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 34 days.

(21) Appl. No.: 12/449,200

(22) PCT Filed: Jan. 24, 2008

(86) PCT No.: PCT/JP2008/000070
§ 371 (c)(1),
(2), (4) Date: Jul. 28, 2009

(87) PCT Pub. No.: WO2008/105136
PCT Pub. Date: Sep. 4, 2008

(65) Prior Publication Data
US 2010/0105191 A1    Apr. 29, 2010

(30) Foreign Application Priority Data
Feb. 26, 2007 (JP) .................................. 2007-045956

(51) Int. Cl.
*H01L 21/322* (2006.01)

(52) U.S. Cl. ................. 438/476; 257/E21.318

(58) Field of Classification Search ............ 438/476; 257/E21.318
See application file for complete search history.

(56) References Cited

U.S. PATENT DOCUMENTS

| | | | |
|---|---|---|---|
| 5,401,669 A | 3/1995 | Falster et al. |
| 5,543,343 A | 8/1996 | Bryant et al. |
| 5,742,095 A | 4/1998 | Bryant et al. |
| 5,811,865 A | 9/1998 | Hodges et al. |
| 5,927,992 A | 7/1999 | Hodges et al. |
| 5,954,873 A | 9/1999 | Hourai et al. |
| 5,968,264 A | 10/1999 | Iida et al. |
| 6,461,939 B1 | 10/2002 | Furihata et al. |

(Continued)

FOREIGN PATENT DOCUMENTS

JP    A-62-293727    12/1987

(Continued)

OTHER PUBLICATIONS

Jul. 13, 2011 Chinese Office Action issued in Chinese Application No. 200880006135.1 with partial English-language translation.

(Continued)

*Primary Examiner* — Tony Tran
(74) *Attorney, Agent, or Firm* — Oliff & Berridge, PLC

(57) ABSTRACT

The present invention provides a method for manufacturing a silicon single crystal wafer, in which a silicon single crystal wafer that is fabricated based on a Czochralski method and has an entire plane in a radial direction formed of an N region is subjected to a rapid thermal annealing in an oxidizing atmosphere, an oxide film formed in the rapid thermal annealing in the oxidizing atmosphere is removed, and then a rapid thermal annealing is carried out in a nitriding atmosphere, an Ar atmosphere, or a mixed atmosphere of these atmospheres. As a result,
there can be provided the manufacturing method that can inexpensively manufacture a silicon single crystal wafer both in which a DZ layer is formed in a wafer surface layer to provide excellent device characteristics and in which an oxide precipitate functioning as a gettering site can be sufficiently formed in a bulk region.

1 Claim, 9 Drawing Sheets

(a)

(b)

(c)

U.S. PATENT DOCUMENTS

2006/0065184 A1* 3/2006 Sakurada et al. ............... 117/19
2006/0075960 A1* 4/2006 Borgini et al. ............... 117/200
2007/0231932 A1* 10/2007 Reynaud et al. ............... 438/14

FOREIGN PATENT DOCUMENTS

| JP | A-06-163531 | 6/1994 |
| JP | A-08-051144 | 2/1996 |
| JP | A-11-079889 | 3/1999 |
| JP | A-11-150112 | 6/1999 |
| JP | B2-3085146 | 9/2000 |
| JP | A-2000-294470 | 10/2000 |
| JP | A-2001-007217 | 1/2001 |
| JP | A-2001-044193 | 2/2001 |
| JP | A-2001-503009 | 3/2001 |
| JP | A-2001-151597 | 6/2001 |
| JP | A-2001-203210 | 7/2001 |
| JP | A-2001-308101 | 11/2001 |
| JP | B2-3731417 | 10/2005 |
| WO | WO 98/45507 A1 | 10/1998 |

OTHER PUBLICATIONS

Feb. 13, 2012 Chinese Office Action issued in Chinese Application No. 200880006135.1 with partial English-language translation.

* cited by examiner

METHOD FOR MANUFACTURING SILICON SINGLE CRYSTAL WAFER

TECHNICAL FIELD

The present invention relates to a method for manufacturing a silicon single crystal wafer that has a DZ layer in which no crystal defect occurs formed at a fixed depth from a wafer surface to a device active region and can form an oxide precipitate that becomes a gettering site in the wafer.

BACKGROUND ART

A silicon single crystal wafer serving as a material for a semiconductor device can be generally fabricated by growing a silicon single crystal based on a Czochralski method (which will be also referred to as a CZ method hereinafter) and performing a process, e.g., slicing or polishing with respect to an obtained silicon single crystal.

In the silicon single crystal grown based on the CZ method in this manner, an oxidation induced stacking fault called an OSF that occurs in a ring-like shape may be produced when subjected to thermal oxidation processing (e.g., 1100° C. for two hours). It has been revealed that a fine defect (which will be also referred to as a Grown-in defect hereinafter) that is formed at crystal growth and adversely affects device performance is present besides the OSF.

Thus, in recent years, for example, Japanese Unexamined Patent Publication (Kokai) No. H11-79889 or Japanese Patent No. 3085146 discloses a single-crystal manufacturing method that is used to obtain a wafer in which such defects are reduced as much as possible.

FIG. 8 shows an example of a relationship between a pulling rate and a defect distribution when a single crystal is grown. This is an example where V/G as a ratio of a pulling rate V (mm/min) when growing the single crystal and an average value G (° C./mm) of an in-crystal temperature gradient in a pulling axis direction in a temperature range from a silicon melting point to 1300° C. is changed by varying the pulling rate V.

It is generally known that a temperature distribution in the single crystal is dependent on a structure in a CZ furnace (which will be also referred to as a hot zone hereinafter) and the distribution hardly varies even if a pulling rate is changed. Therefore, when the structure of the CZ furnace remains the same, V/G is associated with a change in pulling rate alone. That is, the pulling rate V and V/G approximately have a direct proportion relationship. Therefore, the pulling rate V is used for an ordinate in FIG. 8.

In a region where the pulling rate V is relatively high, vacancy type grown-in defects called COPs (Crystal Originated Particles) or FPDs (Flow Pattern Defects) considered as voids as an aggregation of holes, that are point detects called vacancies (which will be also referred to as Va hereinafter), are present in an entire crystal radial region, and this is called a V-Rich region.

When the pulling rate V is slightly reduced than this, OSFs are produced in a ring-like pattern from a periphery of a crystal, the OSFs shrink toward a crystal center as the pulling rate V is lowered, and the OSFs are finally annihilated at the crystal center.

When the pulling rate V is further reduced, a Neutral (which will be also referred to as N hereinafter) region where excess or deficiency of Va or interstitial point defects called Interstitial Silicon (which will be also referred to as I hereinafter) rarely occurs is present. It has been revealed that in this region an agglomerated defect like the COP or the FPD is not present or presence of a defect cannot be detected by a current defect detection method, since this N region is biased toward Va or I but has a saturated concentration or a lower concentration.

This N region is divided into an Nv region where Va is dominant and an Ni region where I is dominant.

When the pulling rate V is further reduced, I becomes supersaturated, defects of L/D (Large Dislocation: an abbreviation of an interstitial dislocation loop, e.g., LSEPD or LEPD) considered as a dislocation loop obtained by agglomeration of I are consequently produced at a low density, and this region is called an I-Rich region.

Under the circumstances, a single crystal pulled up while controlling V/G in a range where the N region can be formed in the entire region along a radial direction from the center of the crystal is sliced into wafers, and polishing each wafer enables obtaining a wafer having a structure where the entire plane in the radial direction becomes the N region and having extremely less defects.

For example, a wafer sliced out at a position A-A in FIG. 8 becomes a wafer having an Nv region in the entire plane as shown in FIG. 9(*a*). FIG. 9(*b*) shows a wafer sliced out at a position B-B in FIG. 8, and an Nv region is present at a wafer central portion while an Ni region is present at an outer periphery thereof.

FIG. 9(*c*) shows a wafer sliced out at a position C-C in FIG. 8, and a wafer having a wafer entire plane formed of an Ni region can be obtained.

It is to be noted that these wafers are just examples, and the Ni region may be present at the wafer central portion while the Nv region may be present at the outer periphery thereof in contrast to the example depicted in FIG. 9(*b*) depending on a hot zone and so on.

When a grown-in defect that is present in a V-Rich region or an I-Rich region appears on a wafer surface, an adverse influence, e.g., a reduction in breakdown voltage of an oxide film when an MOS (Metal Oxide Semiconductor) structure for a device is formed is given to device characteristics, and hence absence of such a defect on a wafer surface layer is demanded.

FIG. 10 schematically shows a relationship between V/G, a Va concentration, and an I concentration, and this relationship is called Voronkov's theory and means that a boundary between a vacancy region and an interstitial silicon region is determined based on V/G.

In more detail, a region where Va is dominant is formed when V/G is equal to or above a critical point (V/G)c, and a region where I is dominant is formed when V/G is equal to or below the critical point. That is, (V/G)c indicates a V/G value at which Va and I have the same concentration.

An I-Rich region in FIG. 10 is a region where an agglomerate of interstitial silicon point defects, i.e., a grown-in defect of L/D is generated since V/G is equal to or below (V/G)i and the interstitial silicon point defects I have a saturated concentration Ci or a higher concentration.

The V-Rich region is a region where an agglomerate of vacancies, i.e., a grown-in defect, e.g., a COP is generated since V/G is equal to (V/G)v or above and vacancies Va have a saturated concentration Cv or a higher concentration.

The N region means a neutral region ((V/G)i to (V/G)osf) where an agglomerate of vacancies or an agglomerate of interstitial silicon point defects is not present.

Further, an OSF region ((V/G)osf to (V/G)v) is usually present in adjacent to this N region.

Meanwhile, a silicon wafer usually contains approximately $7\times10^{17}$ to $10\times10^{17}$ atoms/cm$^3$ (a conversion factor provided by Japan Electronic Industry Development Association (JEIDA) is used) of oxygen in a supersaturated state.

Therefore, when such a silicon wafer is subjected to a heat treatment in, e.g., a device process, supersaturated oxygen in the silicon wafer is precipitated as an oxide precipitate. Such an oxide precipitate is called a BMD (Bulk Micro Defect).

This BMD becomes a problem since it adversely affects device characteristics, e.g., a junction leakage when it is generated in a device active region in a wafer but, on the other hand, this BMD is effective since it functions as a gettering site that captures a metal impurity mixed during a device process when it is present in a bulk other than the device active region.

Therefore, in manufacture of a silicon wafer, a BMD must be formed in a bulk of the wafer, and a defect-free region (Denuted Zone; which will be referred to as a DZ layer hereinafter) where a BMD or a grown-in defect is not present must be maintained near the wafer surface that is a device active region.

In recent years, as a method for manufacturing a silicon wafer which has no BMD generated therein on a silicon wafer shipping stage but is designed to have a gettering capability with a BMD formed in a bulk deeper than a device active region while maintaining a DZ layer having no BMD near a wafer surface that is the device active region by performing a heat treatment in, e.g., a subsequent device process, a method for performing an RTP (Rapid Thermal Process) processing with respect to a silicon wafer (a rapid thermal annealing) is suggested (see, e.g., Japanese Unexamined Patent Publication (Kokai) No. 2001-203210, U.S. Pat. No. 5,401,669, or Published Japanese Translation No. 2001-503009 of the PCT International Application).

This RTP processing is a heat treatment method characterized in that a temperature of a silicon wafer is rapidly increased from a room temperature at a temperature-up speed of, e.g., 50° C./s in a nitride formation atmosphere, e.g., $N_2$ or $NH_3$ or a mixed gas atmosphere obtained by mixing such a gas with a nitride non-formation atmosphere, e.g., Ar or $H_2$, the silicon wafer is heated and held at a temperature of approximately 1200° C. for several-ten seconds, and then it is rapidly cooled at a temperature-down speed of, e.g., 50° C./s.

A mechanism of forming the BMD by performing an oxygen precipitation heat treatment after the RTP processing will now be briefly explained.

First, in the RTP processing, injection of Va occurs from the wafer surface, for example, during maintenance of a high temperature of 1200° C. in an $N_2$ atmosphere, and annihilation due to redistribution based on diffusion of Va and recombination with I occurs while cooling in a temperature range of 1200° C. to 700° C. at a temperature-down speed of, e.g., 50° C. As a result, Va is unevenly distributed in the bulk.

When, e.g., an oxygen precipitation heat treatment is performed with respect to the wafer in such a state, each oxide precipitate is clustered in a region having a high Va concentration, and the clustered oxide precipitate grows, thereby forming a BMD. When the oxygen precipitation heat treatment is performed with respect to the silicon wafer subjected to the RTP processing, a BMD having a distribution in a wafer depth direction is formed according to a concentration profile of Va formed in the RTP processing.

As above, a technology that forms a silicon single crystal consisting of an N region is developed to eliminate a crystal defect, e.g., a COP or an OSF that adversely affects device performance, or a manufacturing method using the RTP processing is carried out when manufacturing a silicon single crystal wafer having a DZ layer in a surface layer and having a BMD in a bulk region.

However, first, in a silicon single crystal wafer consisting of an N region, since an initial oxygen concentration is relatively low, oxygen precipitation required for gettering cannot be satisfactorily obtained in some cases. Further, even though an entire plane in a radial direction is the N region, an Nv region and an Ni region are usually mixedly present, oxygen precipitation hardly occurs in the Ni region including a relatively large amount of I, and prominent unevenness occurs in a radial distribution of a BMD density in some cases.

As means for solving such problems of oxygen precipitation in the N region, there is a method for injecting vacancies into a wafer by a high-temperature RTP and facilitating oxygen precipitation based on these vacancies.

However, when the RTP is performed with respect to a silicon single crystal wafer formed of an N region in which Nv and Ni regions are mixedly present, TDDB (Time Dependent Dielectric Breakdown) characteristics are decreased in a region where defects are detected when a high-sensitivity OSF inspection that performs heat treatments on two stage at 1000° C. for three hours and 1150° C. for 100 minutes is carried out even though this region is the Nv region or a region where an OSF is not detected in a regular inspection. This tendency is more prominent in a wafer having a diameter of 300 mm larger than 200 mm.

Moreover, for example, a method using a silicon single crystal wafer in which an entire plane in a radial direction is formed of an Ni region can be also considered, but a manufacture margin for the silicon single crystal is narrow, productivity is low, and a manufacturing cost is notably increased.

DISCLOSURE OF THE INVENTION

In view of the above-explained problems, it is an object of the present invention to provide a manufacturing method that can inexpensively manufacture a silicon single crystal wafer both in which a DZ layer is formed in a wafer surface layer to provide excellent device characteristics and in which an oxide precipitate functioning as a gettering site can be sufficiently formed in a bulk region.

To achieve the object, the present invention provides a method for manufacturing a silicon single crystal wafer, wherein a silicon single crystal wafer that is fabricated based on a Czochralski method and has an entire plane in a radial direction formed of an N region is subjected to a rapid thermal annealing in an oxidizing atmosphere, an oxide film formed in the rapid thermal annealing in the oxidizing atmosphere is removed, and then a rapid thermal annealing is carried out in a nitriding atmosphere, an Ar atmosphere, or a mixed atmosphere of these atmospheres.

As explained above, in the method for manufacturing a silicon single crystal wafer according to the present invention, in the first place, the silicon single crystal wafer that is fabricated by the Czochralski method and has the entire plane in the radial direction formed of the N region is subjected to the rapid thermal annealing in the oxidizing atmosphere. When this rapid thermal annealing in the oxidizing atmosphere is carried out, the interstitial silicon can be injected into the wafer, thereby annihilating or inactivating an OSF nucleus. And then, the oxide film formed by the rapid thermal annealing in the oxidizing atmosphere is then removed, and the rapid thermal annealing is subsequently performed in the nitriding atmosphere, the Ar atmosphere, or the mixed atmosphere of these atmospheres to effect manufacture, thereby efficiently injecting vacancies into the wafer. Further, because of the rapid thermal annealing, a time required for the heat treatment can be reduced. Therefore, the silicon single crystal wafer that has the DZ layer in the surface layer, excellent TDDB characteristics, and can form the sufficient BMD in the bulk region by, e.g., the oxygen precipitation heat treatment can be efficiently manufactured without increasing a cost.

At this time, in particular, it is possible that the silicon single crystal wafer that has the entire plane in the radial direction formed of the N region is the one in which an Ni region and an Nv region are mixedly present.

As explained above, according to the present invention even in the silicon single crystal wafer in which the Ni region and the Nv region are mixedly present, a silicon single crystal wafer that can produce the sufficient BMD in the bulk region and can have a high gettering capability with excellent TDDB characteristics in the wafer entire plane can be manufactured. Furthermore, manufacture can be carried out with a large manufacture margin and high productivity at a lower cost as compared with a case where the Ni region alone is present.

Such a method for manufacturing a silicon single crystal wafer according to the present invention can manufacture the silicon single crystal wafer that has the DZ layer in the surface layer and can sufficiently form the BMD in the bulk without increasing a cost.

BEST MODES FOR CARRYING OUT THE INVENTION

An embodiment according to the present invention will now be explained hereinafter with reference to the drawings, but the present invention is not restricted thereto.

Figure 1:
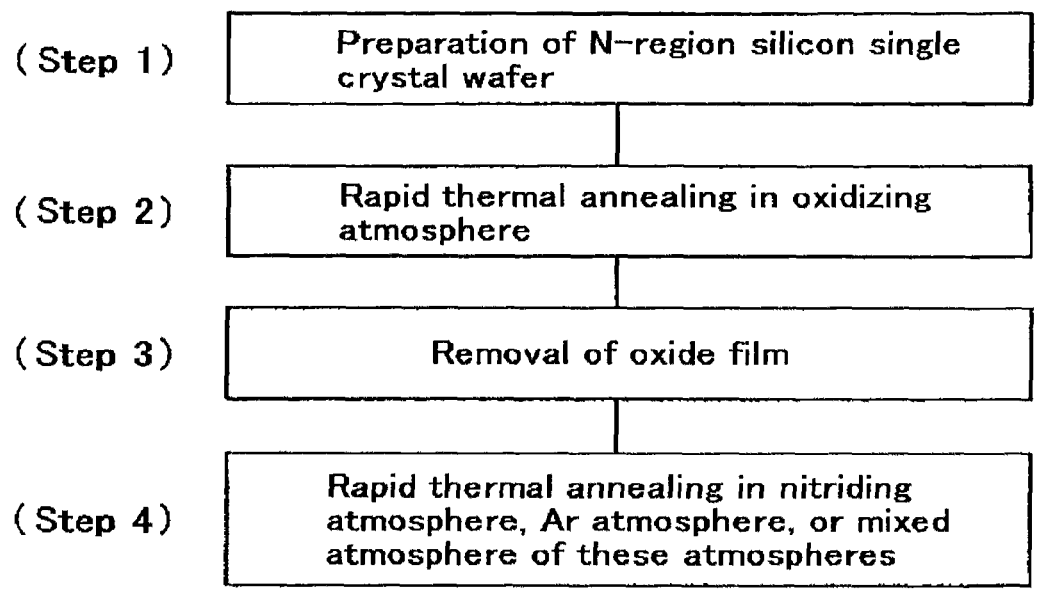
FIG. 1 is a process drawing showing an example of a procedure of a method for manufacturing a silicon single crystal wafer according to the present invention.

FIG. 1 shows an example of a procedure of a method for manufacturing a silicon single crystal wafer according to the present invention.

As shown in FIG. 1, as a flow of the entire procedure, an N-region silicon single crystal wafer is first prepared (a step 1), and a rapid thermal annealing is performed with respect to this wafer in an oxidizing atmosphere (a step 2). Then, an oxide film on a wafer surface formed at the step 2 is removed (a step 3). Subsequently, a rapid thermal annealing is again carried out in a nitriding atmosphere, an Ar atmosphere, or a mixed atmosphere of these atmospheres (a step 4).

An apparatus that can be used at these steps will now be explained.

Figure 2:
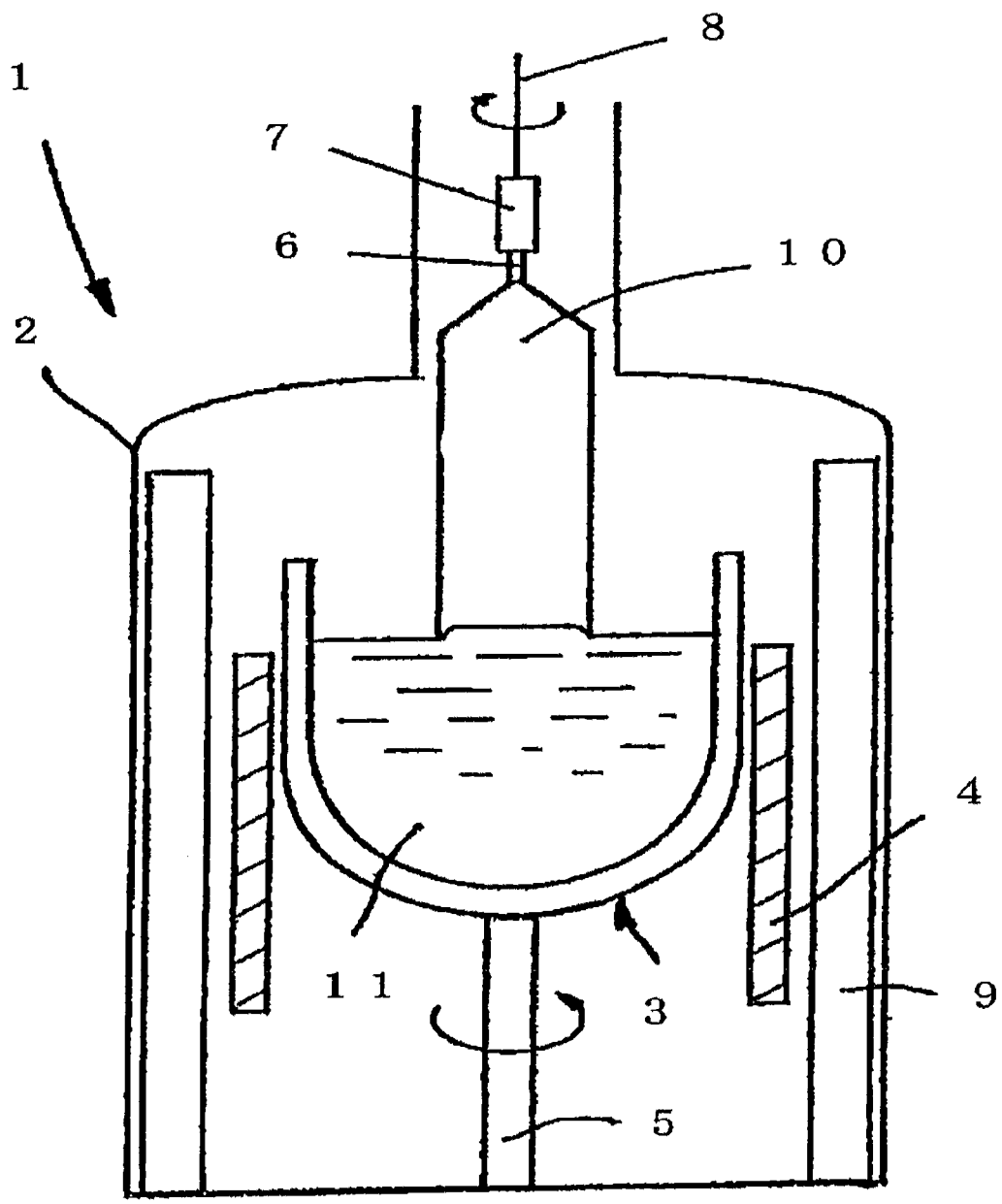
FIG. 2 is a schematic view showing an example of a single-crystal pulling apparatus that can be used in the manufacturing method according to the present invention.

When pulling the silicon single crystal by the Czochralski method in preparation of the N-region silicon single crystal wafer, such a single-crystal pulling apparatus as shown in FIG. 2 can be used, for example.

As shown in FIG. 2, in this single-crystal pulling apparatus 1, a crucible 3 that accommodates a silicon melt 11 serving as a raw material of a silicon single crystal ingot 10 is provided in a pulling chamber 2. Furthermore, this crucible 3 includes a crucible holding shaft 5 and its rotation mechanism (not shown), and the crucible 3 can be rotated during growth of a single crystal. Moreover, a heater 4 for heating is arranged around this crucible 3, a heat insulating material 9 is arranged around an outer side of the heater 4. Additionally, a seed chuck 7 that holds a seed crystal 6 of silicon, a wire 8 that pulls the seed chuck 7, and a wind-up mechanism (not shown) that rotates or winds up the wire 8 are provided above the silicon melt 11 in the crucible 3. In this manner, in the manufacturing method according to the present invention, the same single-crystal pulling apparatus as usual can be used.

According to such an apparatus 1, the silicon single crystal ingot 10 is pulled up from the silicon melt 11 as a raw material by the wire 8 while adjusting, e.g., a pulling rate.

An apparatus that performs each rapid thermal annealing with respect to a silicon single crystal wafer obtained by slicing the silicon single crystal ingot 10 pulled up by the single-crystal pulling apparatus 1 will now be explained.

Figure 3:
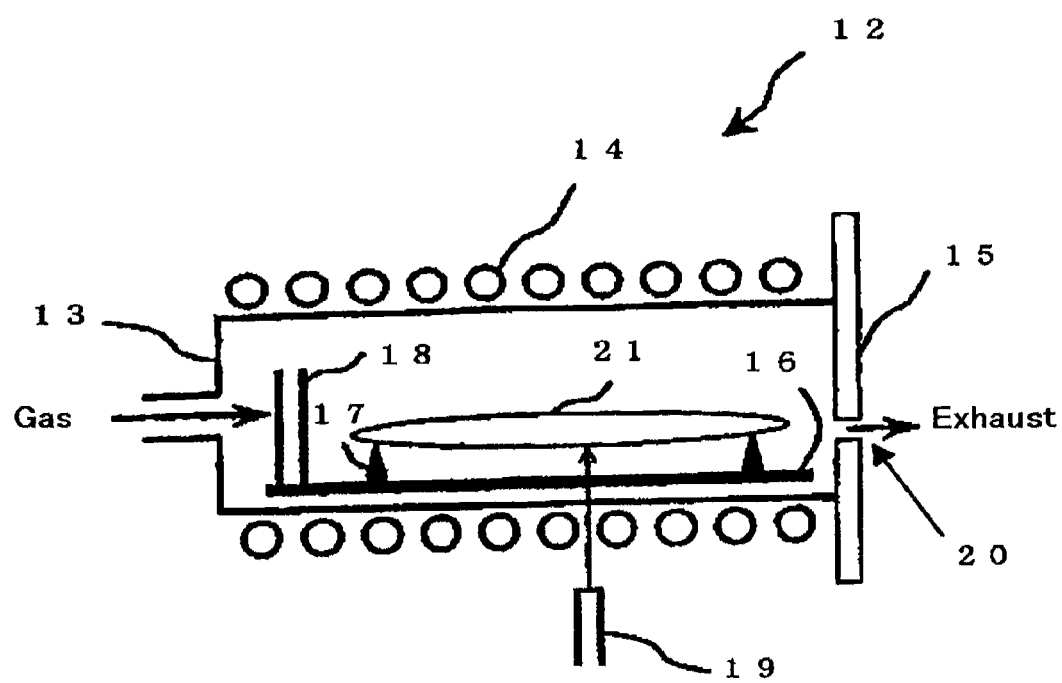
FIG. 3 is a schematic view showing an example of a rapid thermal annealing apparatus that can be used in the manufacturing method according to the present invention.

A rapid thermal annealing apparatus 12 depicted in FIG. 3 has a chamber 13 formed of quartz so that the silicon single crystal wafer 21 can be subjected to the rapid thermal annealing in this chamber 13. Heating is carried out by a heating lamp 14 (e.g., a halogen lamp) arranged to surround the chamber 13 from upper and lower sides and left and right sides. This heating lamp 14 can control electric power that is independently supplied.

An auto shutter 15 is provided on a gas exhaust side, thereby shielding against outside air. A non-illustrated wafer insertion opening configured to be opened/closed by a gate valve is provided in the auto shutter 15. Further, a gas exhaust opening 20 is provided in the auto shutter 15, thus adjusting an in-furnace atmosphere.

Furthermore, the silicon single crystal wafer 21 is arranged on a three-point support portion 17 formed on a quartz tray 16. A quartz buffer 18 is provided on a gas introduction opening side of the tray 16, and an introduction gas such as an oxidizing gas, a nitriding gas, or an Ar gas can be prevented from directly coming into contact with the silicon single crystal wafer 21.

Moreover, a non-illustrated temperature measurement special window is provided in the chamber 13, and a pyrometer 19 installed outside the chamber 13 can measure a temperature of the silicon single crystal wafer 21 through this special window.

Also for the rapid thermal annealing apparatus 12, the same one as usual can be used.

Each step in the manufacturing method according to the present invention that is carried out by using the respective apparatuses depicted in FIGS. 2 and 3 will now be explained hereinafter.

(Step 1: Preparation of N-Region Silicon Single Crystal Wafer)

At a step 1, the silicon single crystal wafer 21 which has an entire plane in the radial direction formed of the N region and is subjected to rapid thermal annealing on two stages (a rapid thermal annealing in an oxidizing atmosphere (RTO (Rapid Thermal Oxidation) processing on a first stage), a rapid thermal annealing in a nitriding atmosphere, an Ar atmosphere, or a mixed atmosphere of these atmospheres (RTA (Rapid Thermal Annealing) processing on a second stage)) is prepared.

That is, the single-crystal pulling apparatus 1 shown in FIG. 2 is first used to pull up the silicon single crystal ingot 10 based on the Czochralski method. At this time, to enable slicing out a silicon single crystal wafer 21 whose entire plane in the radial direction is the N region from the pulled silicon single crystal ingot 10, for example, a pulling rate is appropriately adjusted to control V/G, and pulling is carried out in such a manner that a defect region in the silicon single crystal ingot 10 can have a distribution meeting an object. This controlling method for, e.g., V/G is not restricted in particular. As explained above, it is sufficient that control is performed by adjusting the pulling rate or changing an in-furnace structure.

After the silicon single crystal ingot 10 is pulled up in this manner, a wire saw is used to slice out each wafer, thereby obtaining the silicon single crystal wafer 21 whose entire plane in the radial direction is the N region.

It is to be noted that the present invention is particularly effective with respect to the silicon single crystal wafer 21 in which an Ni region and an Nv region are mixedly present. More specifically, when the Ni region and the Nv region are mixedly present, a wider manufacture margin can be assured in pulling of the silicon single crystal ingot 10 as compared with a case where the entire plane is, for example, the Ni region, and hence the silicon single crystal ingot 10 can be more easily pulled at a lower cost, thereby planning improving productivity. Additionally, even if the Nv region is present, the silicon single crystal wafer having excellent TDDB characteristics can be provided.

An case where the N-region silicon single crystal wafer in which the Ni region and the Nv region are mixedly present is used at the following steps 2 to 4 will now be explained.

(Step 2: Rapid Thermal Annealing in Oxidizing Atmosphere)

Subsequently, as a step 2, the rapid thermal annealing apparatus 12 depicted in FIG. 3 is used to perform a rapid thermal annealing with respect to the prepared N-region silicon single crystal wafer 21. As an atmosphere in the chamber 13 at this time, an oxidizing atmosphere can suffice, a dry oxygen atmosphere can be used, or a wet oxygen atmosphere can be utilized, for example. It is to be noted that a thermal oxide film is formed on a surface of the silicon single crystal wafer 21 based on the rapid thermal annealing in this oxidizing atmosphere.

As heat treatment conditions at this moment, for example, a temperature can be increased at a temperature-up speed of 50° C./s, the temperature can be maintained at approximately 900 to 1250° C. for 10 to 30 seconds, and then the temperature can be reduced at a temperature-down speed of 50° C./s. As a result of repeatedly conducting experiments about the rapid thermal annealing in this oxidizing atmosphere to carry on research, the present inventor has discovered that an improvement in, e.g., TDDB characteristics can be basically further considerably obtained in an Nv region or such a region where a defect is detected by an OSF inspection that performs heat treatments on two stages (at 1000° C. for 3 hours and 1150° C. for 100 minutes) as will be explained later when a maximum temperature is higher and a holding time at the maximum temperature is longer as a rapid thermal annealing. However, conditions, e.g., the maximum temperatures or the holding time are not restricted in particular, and they can be appropriately adjusted each time based on, e.g., a size of an OSF nucleus in the silicon single crystal wafer 21 after slicing. For example, when a size of the OSF nucleus is relatively large from the beginning, setting each maximum temperature to a relatively high value and setting the longer holding time can suffice.

As a mechanism of improving TDDB characteristics by performing the rapid thermal annealing in the oxidizing atmosphere at the step 2 in advance, it can be considered that this improvement is realized since interstitial silicon is first injected into the silicon single crystal wafer 21 and the OSF nucleus present in the wafer can be annihilated or inactivated. Therefore, it can be considered that, even if the rapid thermal annealing is performed in a nitriding atmosphere, an Ar atmosphere, or a mixed atmosphere of these atmospheres at a subsequent step 4 to inject vacancies into the wafer for facilitation of oxygen precipitation and then an oxygen precipitation heat treatment for BMD formation or a heat treatment in a device process is carried out, since the OSF nucleus is already annihilated or inactivated, the OSF nucleus can be prevented from growing into a crystal defect, thereby avoiding degradation and achieving improvement of device characteristics.

On the other hand, in a conventional method for manufacturing a silicon single crystal wafer that performs a rapid thermal annealing in a nitriding atmosphere, an Ar atmosphere, or a mixed atmosphere of these atmospheres at a step 4 without carrying out this step 2 (and a later-explained step 3) in contrast to the present invention that performs the step 2 in advance, since annihilation or inactivation of the OSF nucleus is not performed before the step 4, the nucleus grows and a crystal defect is apt to be produced in the Nv region or a region where a defect is detected by a high-sensitivity OSF inspection when, e.g., an oxidation precipitation heat treatment or a heat treatment in a device process is carried out, thereby degrading TDDB characteristics.

(Step 3: Removal of Oxide Film)

The oxide film is formed on the surface of the silicon single crystal wafer 21 by the step 2. When a rapid thermal annealing in a nitriding atmosphere, an Ar atmosphere, or a mixed atmosphere of these atmospheres at a subsequent step 4 is performed in this state, this thermal oxide film serves as a mask, and hence vacancies cannot be efficiently injected into the silicon single crystal wafer 21.

Therefore, vacancies cannot be sufficiently injected in the wafer entire plane in the first place, and hence formation of a BMD becomes insufficient in a bulk region even though an oxygen precipitation heat treatment is carried out, and a gettering capability cannot be satisfactorily obtained.

However, in the present invention, since the oxide film formed at the step 2 is removed at the step 3 and then the step 4 is carried out, injection of vacancies is not obstructed by the oxide film at the step 4, and vacancies can be efficiently injected. Therefore, vacancies can be sufficiently injected in the entire plane of the wafer, oxygen precipitation is facilitated, and a BMD can be sufficiently formed in a bulk region, thereby manufacturing the wafer having a high gettering capability.

It is to be noted that a method for removal of the oxide film at the step 3 is not restricted in particular, and a hydrofluoric acid can be used to effect removal as often adopted in removal of a silicon oxide film, for example.

(Step 4: Rapid Thermal Annealing in Nitriding Atmosphere, Ar Atmosphere, or Mixed Atmosphere of these Atmospheres)

As explained above, after removing the oxide film at the step 3, the rapid thermal annealing apparatus 12 depicted in FIG. 3 is used to again perform the rapid thermal annealing with respect to the silicon single crystal wafer 21. However, an atmosphere in the chamber 13 at this moment is a nitriding atmosphere, an Ar atmosphere, or a mixed atmosphere of these atmospheres. As the nitriding atmosphere, there is, e.g., $NH_3$ or $N_2$.

As explained above, vacancies are injected into the silicon single crystal wafer 21 by this rapid thermal annealing, a BMD can be formed in a bulk, and a gettering capability can be provided.

It is to be noted that, as heat treatment conditions, for example, a temperature can be increased at a temperature-up speed of 50° C./s, the temperature of approximately 900° C. to 1250° C. can be maintained for 10 s to 30 s, and then the temperature can be decreased at a temperature-down speed of 50° C./s. The rapid thermal annealing conditions are not restricted in particular, and the same rapid thermal annealing conditions as usual can be adopted.

Example 1, Comparative Example 1

A p-type silicon single crystal ingot which has a resistivity of 9.2 Ωcm, an initial oxygen concentration of 11.0 ppma (JEIDA), an N region in the entire plane (an Ni region at a central portion, an Nv region at an outer peripheral portion), and a diameter of 300 mm and in which 102 OSFs are detected per $cm^2$ in the outer peripheral portion by a high-sensitivity OSF inspection was grown by using the single-crystal pulling apparatus 1 depicted in FIG. 2, and wafers sliced out from this silicon single crystal ingot and subjected to a chemical etching process were prepared (CW wafers) for Example 1 and Comparative Example 1, respectively.

As Example 1 corresponding to the manufacturing method according to the present invention, such a rapid thermal annealing apparatus 12 as shown in FIG. 3 was used to increase a temperature of the CW wafer in a dry oxygen atmosphere at a temperature-up speed of 50° C./s, perform a rapid oxidation heat treatment at 1050° C. to 1250° C. for 10 s to 30 s, and then reduce a temperature of the wafer at a temperature-down speed of 50° C./s (RTO processing on a first stage). At this time, a thermal oxide film of at least 3.5 nm or above was formed on the wafer, but this thermal oxide film was completely removed based on HF cleaning.

Thereafter, a rapid thermal annealing (RTA processing on a second stage) was carried out in a mixed atmosphere of $NH_3$ 0.75 L/min+Ar 14.25 L/min at 1175° C. for 10 s, and the wafer was cooled at a temperature-down speed of 50° C./s. Subsequently, double-side polishing and single-side polishing were performed to fabricate a mirror-polished wafer (a PW wafer).

As thermal simulation simulating a device manufacture process, heat treatments of (900° C., 30 min)+(1000° C., 30 min)+(800° C., 180 min)+(900° C., 60 min) were carried out with respect to this PW wafer, then a thermal oxide film of 25 nm was formed, and an oxide dielectric breakdown voltage was measured.

It is to be noted that a commercially available 300 mm RTP apparatus, Vantage Radiance, manufactured by Applied Materials was used as the rapid thermal annealing apparatus.

Further, as Comparative Example 1 corresponding to a conventional manufacturing method, RTA processing on a second stage, thermal simulation simulating a device manufacturing process, and measurement of oxide dielectric breakdown voltage characteristics were performed in the same way as Example 1 except that RTO processing on a first stage and subsequent HF cleaning was not carried out.

Figure 4:
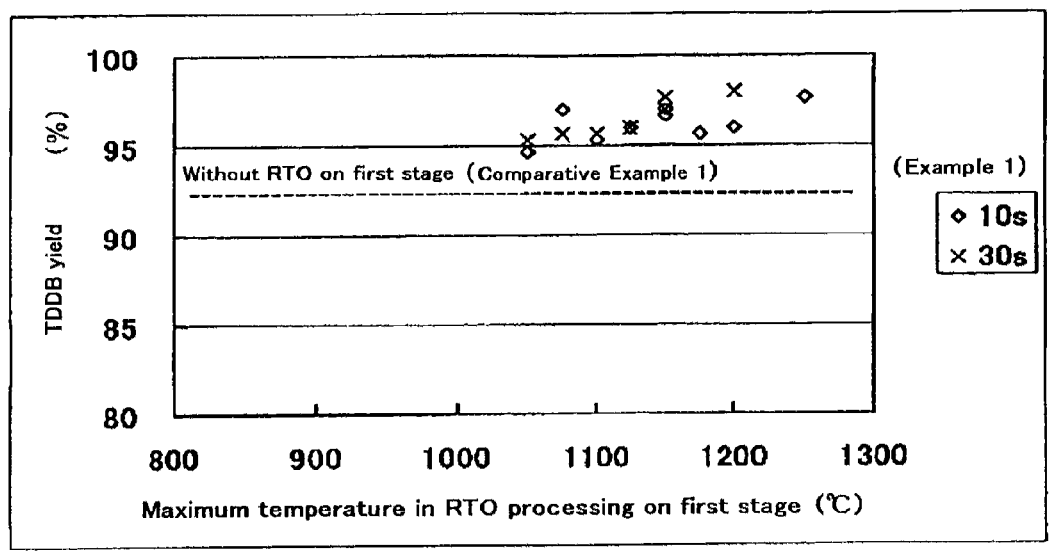
FIG. 4 is a graph showing evaluation results of TDDB characteristics of Example 1 and Comparative Example 1.

FIG. 4 shows TDDB evaluation results of Example 1 and Comparative Example 1. An abscissa in the graph represents a maximum temperature in the RTO processing on the first stage, and an ordinate of the same represents a percentage of cells in a wafer that are 5 $C/cm^2$ or above when a constant current TDDB was evaluated (i.e., a percentage of cells that were not broken even though charged to 5 $C/cm^2$) as a yield.

In the CW wafer utilized this time, TDDB characteristics were lowered in a region of a wafer outer peripheral portion where an OSF was detected in a preliminary high-sensitivity OSF inspection and a yield was up to just 92.3% when the RTO processing on the first stage was not performed like Comparative Example 1.

On the other hand, when the RTO processing was performed on the first stage like Example 1, the number of failure cells was reduced, a high value of substantially 95% or above was able to be obtained, and it can be understood that the wafer was improved as compared with Comparative Example 1. It is to be noted that a tendency of an increase of a TDDB yield was basically observed when an RTO temperature was higher and a holding time at a maximum temperature was longer even though data fluctuated. As explained above, it can be considered that more OSF nuclei can be annihilated or inactivated and can be prevented from growing into crystal defects when conditions of a higher temperature and a longer time are adopted for the rapid thermal annealing.

Example 2, Comparative Example 2

A p-type silicon single crystal ingot which has a resistivity of 10.2 Ωcm, an initial oxygen concentration of 10.9 ppma (JEIDA), an N region in the entire plane (an Ni region at a central portion, an Nv region at an outer peripheral portion), and a diameter of 300 mm and in which 76 OSFs are detected per $cm^2$ in the outer peripheral portion by a high-sensitivity OSF inspection was grown, and wafers sliced out from this silicon single crystal ingot and subjected to a chemical etching process were prepared (CW wafers) for Example 2 and Comparative Example 2, respectively.

As Example 2, processing for the CW wafer and TDDB evaluation were performed in substantially the same manner as Example 1 (as RTO processing on a first stage, a temperature was increased in a dry oxygen atmosphere at a temperature-up speed of 50° C./s, a rapid oxidation heat treatment was carried out at 900° C. to 1200° C. for 30 s, and then the wafer was cooled at a temperature-down speed of 50° C./s).

As Comparative Example 2, processing for the CW wafer and TDDB evaluation were performed in the same way as Example 1 except that the RTO processing on the first stage and subsequent HF cleaning was not carried out.

Figure 5:
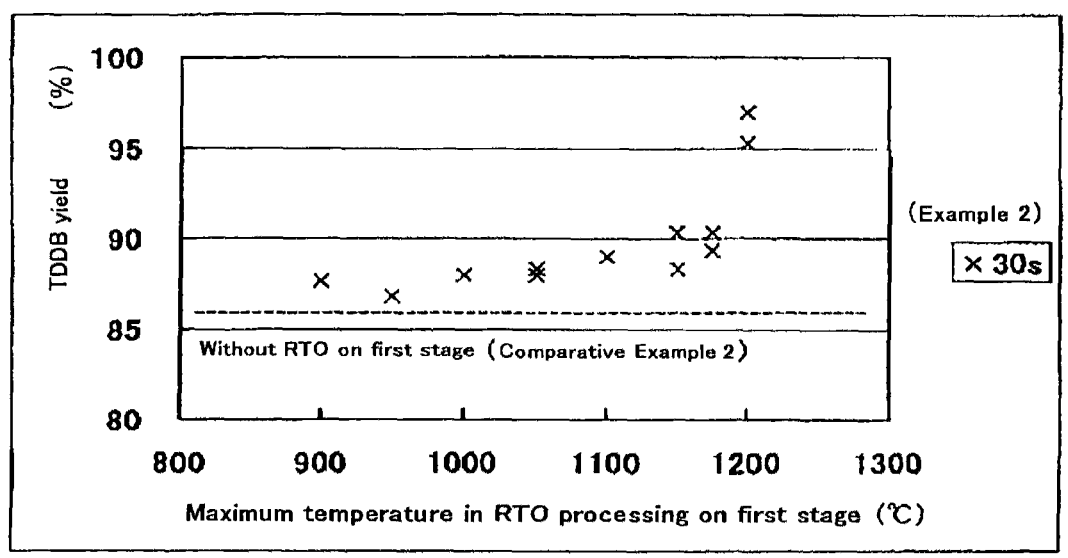
FIG. 5 is a graph showing evaluation results of TDDB characteristics of Example 2 and Comparative Example 2.

FIG. 5 shows evaluation results of Example 2 and Comparative Example 2.

In the CW wafer utilized this time, a TDDB characteristic yield when the RTO processing on the first stage was not performed like Comparative Example 2 was up to just 85.7%.

On the other hand, when the RTO processing on the first stage was performed like Example 2, a degree of improvement in TDDB characteristics was small at 1175° C. or lower, but it was 95% or above under conditions of 1200° C. and 30 s, and a considerable improving effect was observed as compared with Comparative Example 2.

It is considered that the difference of this TDDB characteristic improving effect between Example 1 and Example 2 is caused by the matter that a size of OSF nucleus formed at the time of crystal pulling of the wafer in Example 2 is larger than that of the sample in Example 1 and an RTO temperature enabling recovery of TDDB characteristics is shifted to a high temperature side.

Comparative Examples 3 and 4

A heat treatment at 1150° C. for one hour in a dry oxygen atmosphere (Comparative Example 3) or a heat treatment at 1200° C. for one hour in an Ar atmosphere (Comparative Example 4) which were not rapid thermal annealing were performed with respect to different CW wafers formed from the same silicon single crystal ingot as that in Example 1 in place of the RTO processing on the first stage. For the heat treatments in these cases, a conventionally utilized batch type vertical heat treatment furnace (a resistance heating type) was used. A temperature-up speed was set to 5° C./min until a temperature reaches 1000° C., 3° C./min until the same reaches 1100° C., and 1° C./min until the same exceeds 1100° C.

Further, after the heat treatment in the batch furnace, a thermal oxide film was removed by HF cleaning, and subsequent sample processing and TDDB evaluation were the same as those in Example 1.

As a result, in case of the heat treatment at 1150° C. for one hour in the dry oxygen atmosphere like Comparative Example 3, a TDDB yield was as poor as 79.7%, and failure cells were frequently produced in a wafer outer peripheral portion in particular. It is considered that interstitial silicon was injected like the time of the RTO processing in Example 1, but a temperature-up speed is low, and hence crystal defects grew during an increase in temperature. Therefore, it can be understood that performing rapid heating like Example 1 or Example 2 where the present invention is carried out is important in the RTO processing on the first stage.

On the other hand, when the heat treatment was performed in the non-oxidizing Ar atmosphere at 1200° C. for one hour like Comparative Example 4, a TDDB yield was as good as 99.7%. It is considered that this was obtained because interstitial oxygen in a wafer surface layer was outwardly diffused during the high-temperature heat treatment in the Ar atmosphere and crystal defects were thereby annihilated. Although improvement in GOI characteristics by this high-temperature Ar annealing is well known, but it requires a long time, and hence it is not practical in terms of cost in particular.

Comparative Examples 5 and 6

Since GOI characteristics were improved by the heat treatment in the Ar atmosphere at 1200° C. for one hour in Comparative Example 4, RTA processing in the Ar atmosphere was examined in place of RTO on the first stage in Example 1.

A p-type silicon single crystal ingot which has a resistivity of 9.2 Ωcm, an initial oxygen concentration of 11.1 ppma (JEIDA), an N region in the entire plane (an Ni region at a central portion, an Nv region at an outer peripheral portion), and a diameter of 300 mm and in which 102 OSFs are detected per $cm^2$ in the outer peripheral portion by a high-sensitivity OSF inspection was grown, and wafers sliced out from this silicon single crystal ingot and subjected to a chemical etching process were prepared (CW wafers) for Comparative Examples 5 and 6, respectively.

As Comparative Example 5, a temperature of this CW wafer was increased in the Ar atmosphere at a temperature-up speed of 50° C./s, a rapid thermal annealing was performed at 1200 to 1250° C. for 10 s, and the wafer was cooled at a temperature-down speed of 50° C./s. A native oxide film was removed by HF cleaning, then a rapid thermal annealing was performed in an atmosphere of $NH_3$ 0.75 L/min+Ar 14.25 L/min at 1175° C. for 10 s, and the wafer was cooled at a temperature-down speed of 50° C./s. Thereafter, the same processing and TDDB evaluation as those in Example 1 were carried out.

Further, as Comparative Example 6, sample processing and evaluation were performed in the same manner as Comparative Example 5 except that RTA processing in the Ar atmosphere and subsequent cleaning was not carried out.

Figure 6:
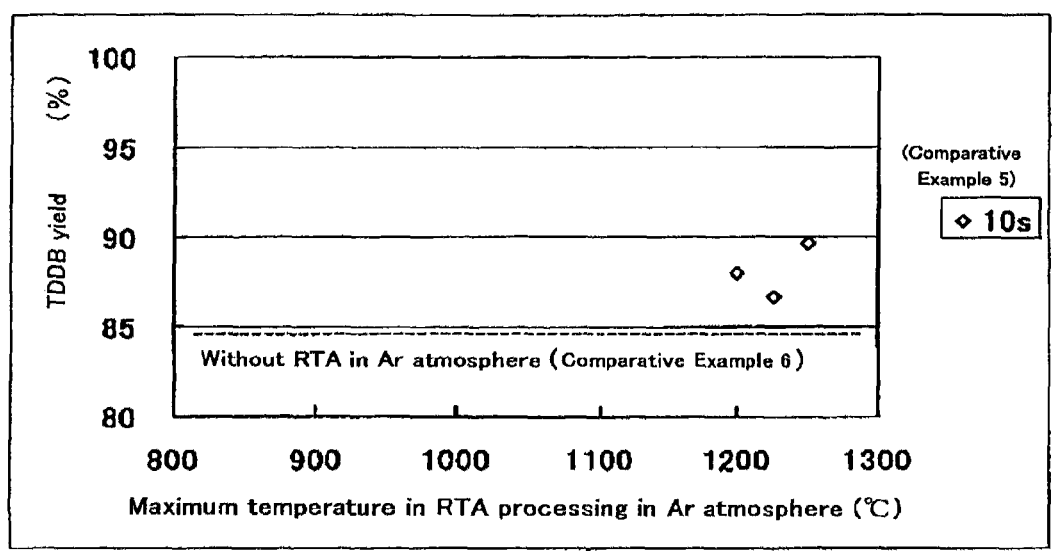
FIG. 6 is a graph showing evaluation results of TDDB characteristics of Comparative Example 5 and Comparative Example 6.

FIG. 6 shows evaluation results of Comparative Example 5 and Comparative Example 6.

When the RTA processing was not performed in the Ar atmosphere like Comparative Example 6, a TDDB characteristic yield was 84.7%.

Furthermore, also when the RTA processing was first performed in the Ar atmosphere like Comparative Example 5, a TDDB characteristic yield was less than 90%, and a notable effect was not observed as compared with Example 1 or Example 2 in which data of the yield of 90% or above and further 95% or above were obtained. It is considered that this is because a defect annihilating function of the heat treatment in the Ar atmosphere is mainly out-diffusion of interstitial oxygen in the first place, and hence out-diffusion becomes insufficient when the heat treatment time is short like the RTA processing and crystal defects cannot be thereby annihilated.

As explained above, it can be understood that the method for performing the RTO processing in advance like Examples 1 and 2 where the present invention is carried out can improve GOI characteristics with the utmost efficiency.

Example 3, Comparative Example 7

An effect of removal of a thermal oxide film that is carried out between the RTO processing on the first stage and the RTA processing on the second stage in the manufacturing method according to the present invention was examined.

A p-type silicon single crystal ingot which has a resistivity of 26.8 Ωcm, an initial oxygen concentration of 11.5 ppma (JEIDA), an N region in the entire plane (an Ni region at a central portion, an Nv region at an outer peripheral portion), and a diameter of 300 mm and in which 48 OSFs are detected per $cm^2$ in the outer peripheral portion by a high-sensitivity OSF inspection was grown, and wafers sliced out from this silicon single crystal ingot and subjected to a chemical etching process were prepared (CW wafers) for Example 3 and Comparative Example 7, respectively.

As Example 3, first, a temperature of the CW wafer was increased in a dry oxygen atmosphere at a temperature-up speed of 50° C./s, a rapid oxidation heat treatment was carried out at 1175° C. for 10 s, and then the wafer was cooled at a temperature-down speed of 50° C./s (RTO processing on a first stage). At this time, a thermal oxide film of 7.9 nm was formed on the wafer, but this thermal oxide film was completely removed by HF cleaning.

Subsequently, a rapid thermal annealing (RTA processing on a second stage) was carried out in a mixed atmosphere of $NH_3$ 0.75 L/min+Ar 14.25 L/min at 1175° C. for 10 s, and the wafer was cooled at a temperature-down speed of 50° C./s. Thereafter, double-side polishing and single-side polishing were performed to fabricate a mirror-polished wafer (a PW wafer).

As thermal simulation simulating a device manufacturing process, heat treatments of (900° C., 30 min)+(1000° C., 30 min)+(800° C., 180 min)+(900° C., 60 min) were carried out with respect to this PW wafer, and a radial distribution of a BMD density was evaluated by using a bulk defect measuring apparatus MO-441 manufactured by Mitsui Mining And Smelting Co., Ltd.

As Comparative Example 7, the thermal oxide film was not removed after the RTO processing on the first stage, and then the same sample processing and evaluation as those in Example 3 were performed in a state where the thermal oxide film was still present.

Figure 7:
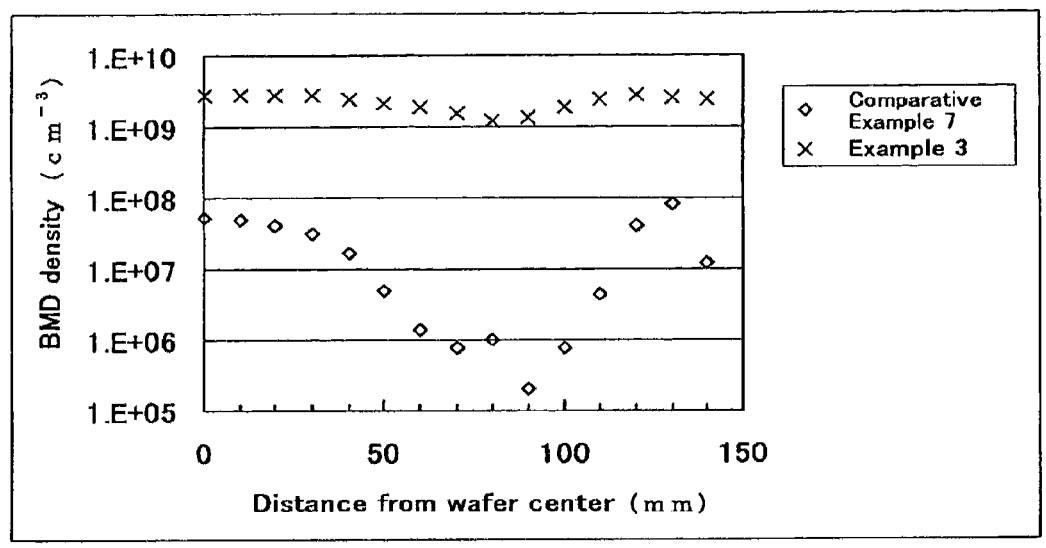
FIG. 7 is a graph showing evaluation results of radial distributions of BMD densities of Example 3 and Comparative Example 7.
Figure 8:
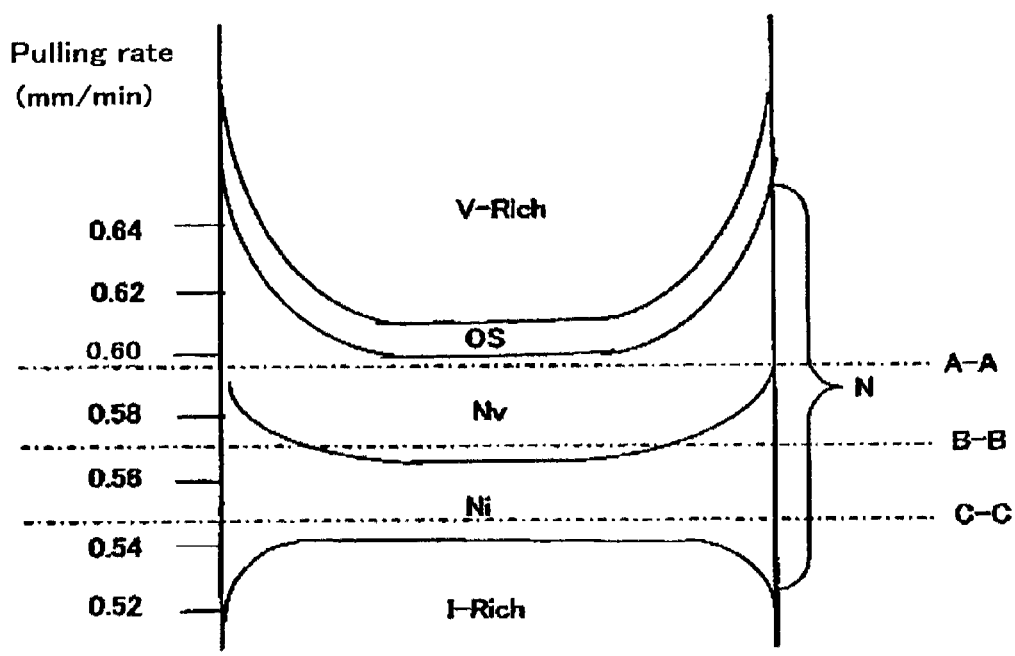
FIG. 8 is a schematic explanatory view showing an example of a relationship between a pulling rate and a defect distribution when a silicon single crystal ingot is grown.
Figure 9:
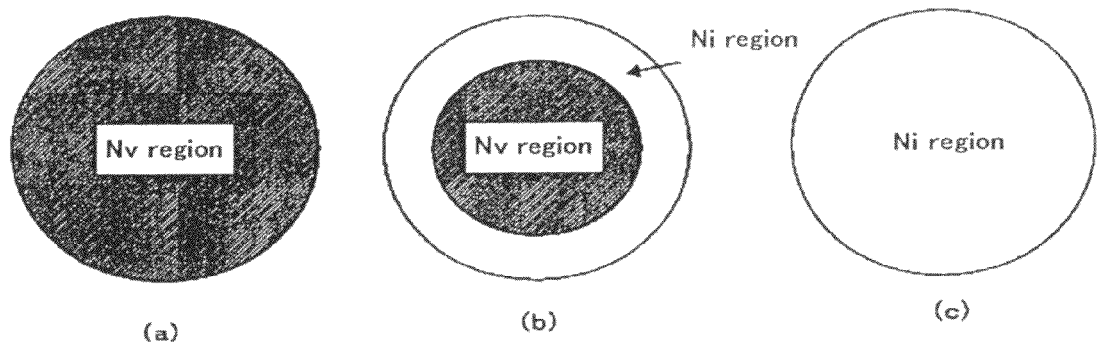
FIG. 9 is a schematic view showing a radial defect distribution of a wafer obtained by slicing a silicon single crystal ingot in a radial direction.
Figure 10:
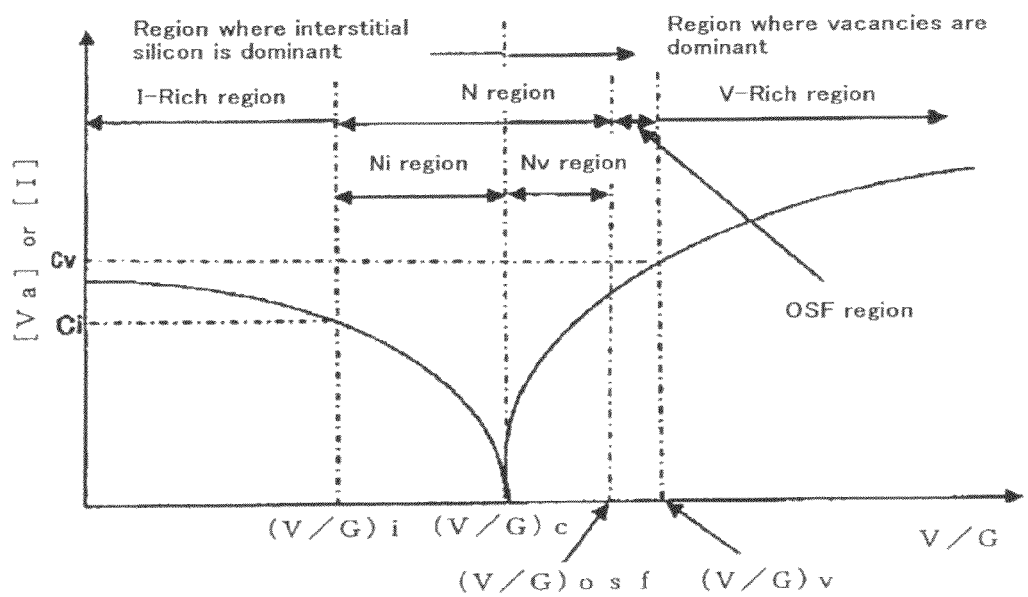
FIG. 10 is a schematic explanatory view showing a relationship between V/G, a Va concentration, and an I concentration.

FIG. 7 shows results of Example 3 and Comparative Example 7.

When the thermal oxide film was removed after the RTO processing on the first stage and then the RTA processing on the second stage was performed like Example 3 where the manufacturing method according to the present invention was carried out, BMDs corresponding to $1E9/cm^3$ or above were detected on the wafer entire plane, and a sufficient gettering capability can be expected.

On the other hand, although Comparative Example 7 corresponds to a manufacturing method disclosed in Japanese Unexamined Patent Publication (Kokai) No. 2001-44193, a BMD density of the wafer subjected to the RTA processing on the second stage with the thermal oxide film being present is less than $1E8/cm^3$, and the gettering effect can be hardly expected. Moreover, considerable unevenness was caused in a radial distribution.

That is, it can be understood that, when the thermal oxide film that is formed by the RTO processing on the first stage and serves as a mask at the time of injection of vacancies if it is not eliminated is removed and then the RTA processing on the second stage is carried out to inject vacancies like Example 3, vacancies can be efficiently injected into a wafer entire plane, thereby manufactured a silicon single crystal wafer that can have a high BMD density on the wafer entire plane and a gettering capability.

It is to be noted that the present invention is not restricted to the foregoing embodiment. The foregoing embodiment is just an example, and any examples that have substantially the same structure and demonstrate the same functions and effects as those in the technical concept described in claims of the present invention are included in the technical scope of the present invention.

The invention claimed is:

1. A method for manufacturing a silicon single crystal wafer, the method comprising:
    subjecting a silicon single crystal wafer after slicing that is fabricated based on a Czochralski method and has an entire plane in a radial direction in plan view formed of a neutral region (N region) consisting of an interstitial silicon dominant region (Ni region) and a vacancies dominant region (Nv region) that are mixedly present to a rapid thermal annealing in an oxidizing atmosphere wherein the wafer is heated at a temperature in a range of from 900 to 1250° C. and maintaining for an amount of time in a range of from 10 to 30 seconds, and thereafter
    removing from the silicon single crystal wafer an oxide film formed in the rapid thermal annealing in the oxidizing atmosphere, and then
    subjecting the silicon single crystal wafer to a rapid thermal annealing in a nitriding atmosphere, an Ar atmosphere, or a mixture of nitriding and Ar atmospheres~wherein the wafer is heated at a temperature in a range of from 900 to 1250° C. and maintaining for an amount of time in a range of from 10 to 30 seconds.

* * * * *